(12) United States Patent
Drabe et al.

(10) Patent No.: US 8,357,944 B2
(45) Date of Patent: Jan. 22, 2013

(54) SEMICONDUCTOR SUBSTRATE AND METHODS FOR THE PRODUCTION THEREOF

(75) Inventors: Christian Drabe, Dresden (DE);
Alexander Wolter, Dresden (DE);
Roger Steadman, Aachen (DE);
Andreas Bergmann, Steina (DE);
Gereon Vogtmeier, Aachen (DE); Ralf Dorscheid, Aachen (DE)

(73) Assignees: Fraunhofer-Gesellschaft zur Forderung der Angewandten Forschung E.V., Munich (DE);
Koninklijke Philips Electronics, N.V., Eindhoven (NL)

( * ) Notice: Subject to any disclaimer, the term of this patent is extended or adjusted under 35 U.S.C. 154(b) by 643 days.

(21) Appl. No.: 12/063,382

(22) PCT Filed: Aug. 10, 2006

(86) PCT No.: PCT/DE2006/001450
§ 371 (c)(1),
(2), (4) Date: Aug. 2, 2010

(87) PCT Pub. No.: WO2007/016924
PCT Pub. Date: Feb. 15, 2007

(65) Prior Publication Data
US 2010/0295066 A1    Nov. 25, 2010

(30) Foreign Application Priority Data

Aug. 11, 2005   (DE) .......................... 10 2005 039 068

(51) Int. Cl.
*H01L 29/18* (2006.01)
(52) U.S. Cl. ........................................................ 257/88
(58) Field of Classification Search .................... 257/88
See application file for complete search history.

(56) References Cited

U.S. PATENT DOCUMENTS

| 815,726 A | 3/1906 | Mehlig |
| 7,560,802 B2 | 7/2009 | Kalvesten et al. |
| 2003/0020756 A1 | 1/2003 | Bates et al. |

(Continued)

FOREIGN PATENT DOCUMENTS

| DE | 198 16 245 A1 | 10/1999 |
| EP | 0 926 726 A1 | 6/1999 |

(Continued)

OTHER PUBLICATIONS

Denso Corp., "Method for manufacturing semiconductor device, and semiconductor device," Patent Abstract of Japan, Publication Date: Jan. 17, 2003; English Abstract of JP-2003 017503.

(Continued)

*Primary Examiner* — Anthony Ho
(74) *Attorney, Agent, or Firm* — Millen, White, Zelano & Branigan, P.C.

(57) ABSTRACT

The invention relates to semiconductor substrates and methods for producing such semiconductor substrates. In this connection, it is the object of the invention to provide semiconductor substrates which can be produced more cost-effectively and with which a high arrangement density as well as good electrical conductivity and closed surfaces can be achieved. In accordance with the invention, an electrically conductive connection is guided from its front side through the substrate up to the rear side. The electrically conductive connection is completely surrounded from the outside. The insulator is formed by an opening which is filled with material. The inner wall is provided with a dielectric coating and/or filled with an electrically insulating or conductive material. The electrically conductive connection is formed with a further opening which is filled with an electrically conductive material and is arranged in the interior of the insulator. The openings are formed with step-free inner walls aligned orthogonally to the front side or tapering continuously in the direction of the rear side.

21 Claims, 2 Drawing Sheets

U.S. PATENT DOCUMENTS

Figure 1:
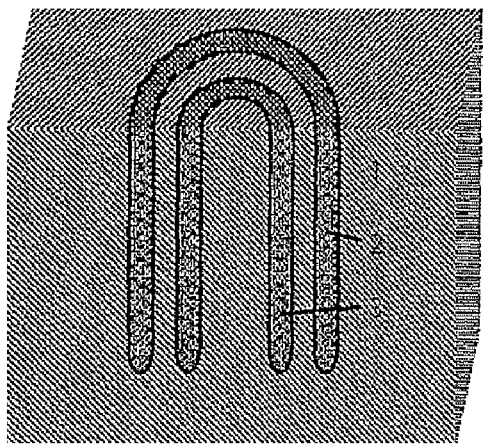

| | | |
|---|---|---|
| 2003/0077877 A1 | 4/2003 | Hartwell |
| 2005/0121768 A1 | 6/2005 | Edelstein et al. |
| 2007/0020926 A1 | 1/2007 | Kalvesten et al. |

FOREIGN PATENT DOCUMENTS

| | | |
|---|---|---|
| EP | 1 306 901 A2 | 5/2003 |
| EP | 1 351 288 A1 | 10/2003 |
| JP | 2002 289623 | 10/2002 |
| JP | 2003 017503 | 1/2003 |
| WO | WO-2004 084300 | 9/2004 |

OTHER PUBLICATIONS

Machine Translation of JP-2002 289623, Publication Date: Oct. 4, 2002, 7 pages.

Machine Translation of JP-2003 017503, Publication Date: Jan. 17, 2003, 13 pages.

Toshiba Corp, "Semiconductor device and method of manufacturing the same," Patent Abstracts of Japan, Publication Date: Oct. 4, 2002; English Abstract of JP-2002 289623.

English Translation of Office Action for related Japanese Patent Application No. 2008 525387 issued Aug. 1, 2012.

SEMICONDUCTOR SUBSTRATE AND METHODS FOR THE PRODUCTION THEREOF

The invention relates to semiconductor substrates and methods for producing such semiconductor substrates. They can be used in different applications, with a miniaturized design being achievable. Optical detectors such as photodiodes can thus, for example, be arranged on semiconductor substrates in accordance with the invention and can be contacted in an electrically conductive manner so that their respective measured signals are supplied to an electronic evaluation and an imaging of detected image signals is also possible. In particular an increased arrangement density of sensors and other elements on a carrier is possible so that a higher resolution can be achieved with optical detectors. In this connection, the whole surface can be utilized and the gaps or spacings between sensor elements or also electrically controllable elements/actuators (e.g. LEDs) can be minimized, but at least considerably reduced with respect to known solutions. A higher flexibility is moreover given for the arrangement of such elements on the front side.

Such arrangements or arrays are frequently formed on semiconductor substrates such as silicon wafers. The individual elements of such a matrix are first guided to the outer margin by a surface wiring which requires corresponding space/room and are wire bonded there.

To counter this disadvantage, trials have been made to form electrically conductive connections in miniaturized form through a semiconductor substrate, that is, so-called through wafer interconnection (TWI).

Such a possibility is described in U.S. Pat. No. 6,815,827 B2. In this connection, a silicon substrate should be processed from the front side and from the rear side. In a first step, a trench structure is formed by an etching process on the front side of the semiconductor substrate to achieve an electrically conductive connection and insulation. A low depth of some few micrometers is etched into the surface. Subsequently, the front side is provided with a dielectric layer which is also formed in the recesses.

The recesses coated in this manner are then filled with a material. Whereupon contact elements are formed on the surface.

Subsequently, the rear side can be planarized and further recesses can be formed likewise by etching into the semiconductor substrate from the rear side of the semiconductor substrate, said recesses communicating with the recesses formed from the front side. The portion of the semiconductor substrate disposed within the recess is electrically insulated with a recess which forms a closed ring structure and completely surrounds a region. The inwardly disposed portion of the semiconductor substrate forms the electrically conductive connection through the semiconductor substrate and can be provided with a contact element at its rear side.

This procedure is thereby in particular complex and/or expensive since semiconductor substrates have to be subjected to an etching procedure twice.

A further substantial disadvantage is, however, the fact that the possibility is thus not given to be able to carry out the production completely in CMOS technology.

Openings remain in the rear side which are not completely filled. This also has an adverse effect inter alia on a manipulation with vacuum manipulators.

The mechanical strength is reduced by the different gap dimensions of the recesses etched into the semiconductor substrate from the front side and from the rear side and a use in particular with effective high forces and accelerations is very restricted.

It is therefore the object of the invention to provide semiconductor substrates which can be produced more cost-effectively and with which a high arrangement density as well as good electrical conductivity and closed surfaces can be achieved.

This object is solved in accordance with the invention by semiconductor substrates having the features of claim 1. They can be manufactured using a method in accordance with claim 10.

Advantageous aspects and further developments of the invention can be achieved using the features designated in the subordinate claims.

Silicon substrates (Si wafers) can be used for the manufacture of semiconductor substrates in accordance with the invention, for example, which can have a sufficiently large thickness of, for example, up to approximately 1000 µm or also below it. The selection can take place while taking account of the desired thickness of a semiconductor substrate completely processed. Such substrates can thus be used in standard dimensions and can be worked to any desired target thickness which can extend up to and into regions of very low thickness.

Starting from the front side, at least two recesses are formed with a minimum depth of e.g. 200 µm by etching, e.g. by dry etching, using a mask, said recesses having inner walls aligned at least practically orthogonally to the surface of the front side or tapering continuously conically starting from the front side and quasi forming "blind holes". In this connection, the inner walls of recesses are generally free of steps so that no abrupt changes in the gap dimension over the depth of recesses are to be seen. At least one recess is arranged in the interior of the other recess and is completely surrounded by it.

A semiconductor substrate prepared in this manner is then further worked such that an electrically insulating coating is formed on the front side which is also formed on the surface, that is, on the inner walls of the recesses. The coating can be an oxide layer, preferably a thermally formed silicon oxide layer.

The recesses are then completely filled with an electrically conductive material. The one inwardly arranged recess or also a plurality of inwardly arranged recesses can be filled with e.g. doped polysilicon and can thus form the electrically conductive connection through the semiconductor substrate after completion due to the increased electrical conductivity.

The outer recess which surrounds the one inwardly disposed recess or all the inwardly disposed recesses and then forms the insulator at the completely processed element can be filled with an electrically insulating material, but for reasons of simplicity likewise with the doped polysilicon. In the latter case, the insulation effect is achieved by the electrically insulating coating of the inner wall of this recess.

After complete filling of the recesses and, optionally, their planarizing, the front side can be further processed, with electrically conductive connections having to be present for filling in inwardly arranged recesses.

Electrical structures, preferably a CMOS circuit, can then be formed on the front side in the processing, said CMOS circuit structure representing one or more sensors and/or electrically controllable elements. (3).

After completion of the structures on the front side, the semiconductor substrate is subsequently worked at its rear side. In this connection, the thickness of the semiconductor substrate is reduced from the rear side until the recesses are also exposed at the rear side and form separate electrical potentials extending through the semiconductor substrate. This can preferably be achieved by grinding and/or chemo-mechanical polishing, but also solely or additionally by etching.

The semiconductor substrate then, for example, has a thickness of at least 200 µm, preferably of approximately 250 µm. The openings obtained in this manner are likewise made free from steps, conically tapering, or their inner walls are made at least practically orthogonal to the surface of the front side, likewise free of steps, with doped polysilicon; the outer opening is optionally filled with a further dielectric material and the gap dimension at the rear side can amount to at least 50% of the gap dimension at the front side.

A gap dimension at the front side of at least 5 µm, preferably of at least 8 µm, should thus be observed so that the gap dimension at the rear side can then amount to at least 4 µm.

A semiconductor substrate thus reduced in its thickness can then be provided with electrical contact elements at the rear side. The contact elements are substantially electrically conductively connected to the doped polysilicon as electrically conductive material filled in inwardly arranged openings, which can be achieved, for example, by means of a correspondingly structured under-bump metallization (UBM). Further contact elements can be formed and/or connected and undefined potentials on the rear side can be avoided. It is also possible to provide the rear side over the full area with an insulating coating and to expose contact elements.

Contact elements can be positioned locally defined on the rear side. Electrically conductive connections can be formed on the electrically insulating coating.

With a semiconductor substrate produced in this manner, sensors can be electrically conductively connected and the respective measured signals can be transmitted by sensors through the semiconductor substrate to corresponding electronic hardware or, with electrically controllable elements, to the latter by an electronic system.

The outer openings which form the insulator of a semiconductor substrate and are then likewise filled e.g. with doped polysilicon can be connected to earth potential or to ground to avoid undefined potentials (floating).

The polysilicon can preferably be doped with phosphor, but also with boron, arsenic or aluminum and be of the n-type or of the p-type.

Unlike known solutions, the production can take place fully in a process chain in which CMOS technology is worked with out there being any risk of contamination by unwanted substances in the plant engineering used.

The thermal budget of a CMOS process management is not impaired, varied or exceeded using the solution in accordance with the invention.

The electrical parameters are reproducible and an increased mechanical strength can be achieved. In addition, mechanical strains in the semiconductor substrate as a result of different thermal expansion can also be avoided, but at least reduced, by a suitable selection of the electrically conductive material, e.g. doped polysilicon.

The geometric design of the openings for the insulator and the electrically conductive connection is variable within large limits, with the latter also applying to the number and arrangement of openings which form the electrically conductive connection through the semiconductor substrate.

With contact elements formed at the rear side, however, at least two e.g. sensors and/or actuators can be electrically conductively connected to one another and can be interconnected as desired.

Sensor elements, sensor arrays, CMOS image sensor arrays, displays, arrays with electrically active elements, which are also accessible from the front side (e.g. visually), but also combinations thereof can be made available with semiconductor substrates in accordance with the invention. The whole area of the front side can be utilized.

The invention will be explained in more detail by way of example in the following.

Figure 2:
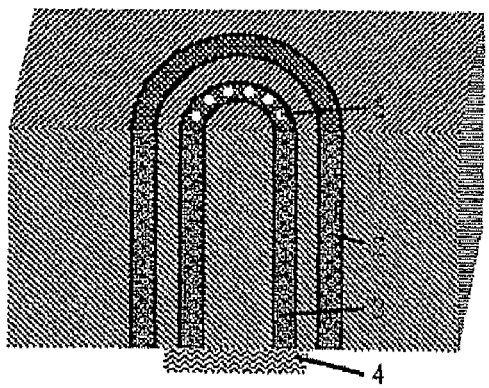
Figure 6:
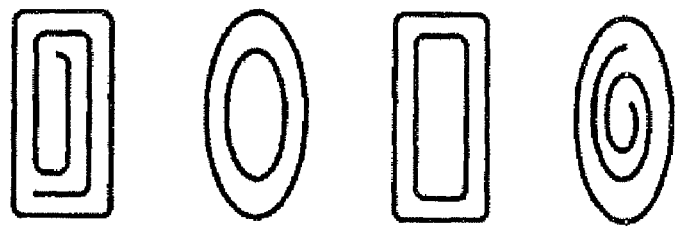
Figure 5:
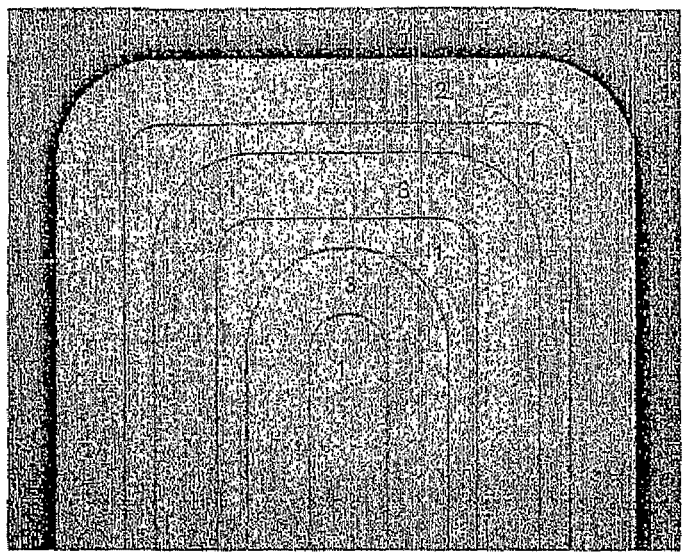
Figure 3:
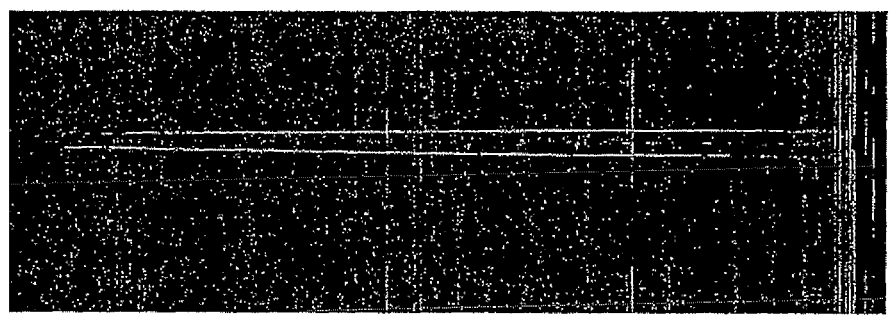
Figure 4:
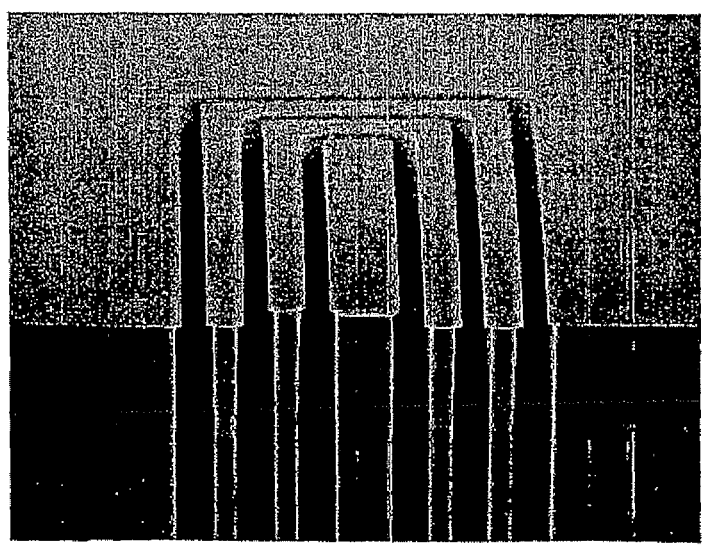

There are shown:

FIG. 1 in schematic form, a sectional representation of a silicon semiconductor substrate with recesses in the form of blind holes;

FIG. 2 in schematic form, a sectional representation of a silicon semiconductor substrate with an electrically conductive connection and an insulator for a semiconductor substrate;

FIG. 3 a microsection of a silicon semiconductor substrate with a recess which is etched into it from the front side and which is filled with doped polysilicon;

FIG. 4 an oblique view of a silicon semiconductor substrate with a total of three recesses etched into the silicon semiconductor substrate;

FIG. 5 a view from above of a silicon semiconductor substrate with three recesses etched into it; and FIG. 6 examples for geometrical designs of the insulator and of openings forming an electrically conductive connection through a silicon semiconductor substrate.

FIG. 1 shows, in schematic form, a silicon semiconductor 1 with recesses which are formed in it in the form of blind holes and which subsequently form the openings 2 and 3 after the thinning of the silicon semiconductor substrate 1, as will be described more precisely in the following.

FIG. 2 shows, in schematic form, an example for the formation of an electrically conductive connection through a silicon semiconductor substrate 1 and an insulator 2. In this connection, recesses with a depth of at least 200 µm were formed from the front side of the semiconductor substrate 1 by a plasma etching process using a correspondingly formed mask. Subsequent to the formation of the recesses, the latter were completely filled with doped polysilicon, with a silicon oxide layer first having been formed at the front side and also at the inner wall of the recesses by thermal oxidation.

Subsequently, the doped polysilicon present in the inwardly arranged recess was exposed at the upper end face so that an electrically conductive connection can be established to the doped polysilicon.

This is indicated by the white dots at the upper end face.

A semiconductor substrate 1 prepared in this manner can then be further processed at the front side and a CMOS circuit can e.g. be formed (not shown).

Subsequently, the semiconductor substrate 1 can then be worked at its rear side. In this connection, the total thickness of the semiconductor substrate 1 can be reduced so much by chemical and mechanical polishing and/or grinding until the lower end faces of the recesses are exposed and they then form the openings 2 and 3 through the semiconductor substrate 1.

The opening 2 made as an outer closed ring structure in this then represents the insulator and the opening 3 formed in the interior of the opening 2, likewise in ring shape, represents the electrically conductive connection. The insulation effect is achieved solely by the oxide layer at the outer inner wall of the outer opening 2.

An electric contact element 4 was then formed by metallization at the rear side of the semiconductor substrate 1 and is directly conductive to the lower end faces of the doped polysilicon present in the inwardly arranged opening 3 and is contacted, as shown here, to the semiconductor substrate 1 in the inner part region.

A recess formed by etching into a semiconductor substrate 1 with an etching depth of 250 μm is shown by FIG. 3 in natural at a silicon semiconductor substrate 1 and has already been completely filled with doped polysilicon.

It becomes clear in this connection that this recess forms a "blind hole" in the semiconductor substrate and is made tapering continuously conically starting from the front side of the semiconductor substrate 1.

A further example is shown in an oblique view in FIG. 4.

In this connection, a total of three recesses, for openings 2 and 3, have been formed through the semiconductor substrate 1.

The outer recess then forms an insulator at the finished semiconductor substrate 1 which completely surrounds the inner region and the electrically conductive connection can be established from the front side to the rear side of the semiconductor substrate 1 with the two openings 3 formed in its interior, with the electrical current flow substantially being ensured by the doped polysilicon filling the openings 3.

FIG. 5 shows a semiconductor substrate surface 1 in a partial view from above after the filling and planarizing of the recesses.

Possible example with geometrical designs for openings 2 and 3 at a semiconductor substrate 1 are shown in FIG. 6.

In this connection, the respective outer opening 2 forms a structure which is closed per se and which completely surrounds the inner region such that the inner region is electrically insulated with respect to the outer region of the semiconductor substrate 1.

The openings 3 arranged at the interior can accordingly be geometrically as desired to the largest possible extent as required, for example concentrically closed, archimedically wound, folded or of meander shape. The number of the inwardly arranged openings 3 can also be freely chosen.

The invention claimed is:

1. A semiconductor substrate, wherein an electrically conductive connection is guided through the semiconductor substrate from its front side to its rear side; and
    the electrically conductive connection is outwardly completely surrounded by an insulator;
    wherein
    the insulator is formed with an opening which is guided through the semiconductor substrate and is filled with a material, wherein
    the inner wall of the opening is provided with a dielectric coating and/or the opening is filled with an electrically insulating or conductive material;
    the electrically conductive connection is formed with at least one further opening which is arranged in the interior of the insulator through the semiconductor substrate and is filled with an electrically conductive material, characterized in that
    the openings (2, 3) have step-free inner walls which are aligned orthogonally to the front side or taper continuously in the direction toward the rear side, starting from the front side of the semiconductor substrate (1) up to the rear side.

2. A semiconductor substrate in accordance with claim 1, characterized in that the opening(s) (3) forming the electrically conductive connection is/are filled with an electrically conductive material and is/are electrically conductively connected at its/their upper end face to a sensor element and at its/their rear end face to a contact element (4).

3. A semiconductor substrate in accordance with claim 1, characterized in that the front side of the semiconductor substrate (1) is provided with an electrically insulating coating through which at least one electrically conductive connection is guided to the upper end face of the opening(s) (3) to the electrically conductive material.

4. A semiconductor substrate in accordance with claim 1, characterized in that the opening (2) forming the insulator is filled with an electrically conductive material and is connected to earth potential or to ground.

5. A semiconductor substrate in accordance with claim 1, characterized in that the substrate (1) has a thickness of at least 200 μm and the openings (2, 3) are guided up to the rear side, starting from the front side.

6. A semiconductor substrate in accordance with claim 1, characterized in that the gap dimension of the openings (2, 3) at the rear side of the substrate (1) amounts to at least 50% of the gap dimension at the front side of the substrate (1).

7. A semiconductor substrate in accordance with claim 6, characterized in that the gap dimension at the front side amounts to at least 5 μm.

8. A semiconductor substrate in accordance with claim 1, characterized in that a CMOS circuit structure is formed at the front side and is contacted through the semiconductor substrate (1) with at least one electrically conductive connection.

9. A semiconductor substrate in accordance with claim 1, characterized in that an electrically conductive connection is contacted through the semiconductor substrate (1) at its front side to an electrically controllable element or contact element.

10. A semiconductor substrate in accordance with claim 1, characterized in that silicon is the substrate material and doped polysilicon is the electrically conductive material.

11. A semiconductor substrate in accordance with claim 1, characterized in that an array with electrically controllable elements and/or sensor elements is formed by a plurality of electrically conductive connections guided through the semiconductor substrate (1).

12. A semiconductor substrate in accordance with claim 1, characterized in that it is formed as a sensor element, a sensor array, a CMOS image sensor array, a display and/or an array with electrically active elements.

13. A method for producing semiconductor substrates, wherein an electrically conductive connection is guided from a front side of the semiconductor substrate (1) through the semiconductor substrate (1) up to its rear side;
    wherein at least two recesses having step-free inner walls are formed in the semiconductor substrate (1) from the front side of the semiconductor substrate (1) by an etching process with a presettable minimum depth such that at least one inner recess is completely surrounded by an outer recess; then
    the outer recess is filled with a dielectric material and/or the inner wall of the outer recess is provided over the full area with an electrically insulating coating and is filled with a material; and
    the inner recess(es) is/are filled with an electrically conductive material or provided with an electrically insulating coating over the full area and filled with an electrically conductive material;
    subsequently, starting from the rear side of the semiconductor substrate (1), its thickness is reduced until the rear-side end faces of the filled recesses are exposed and the outer recess forms an insulator as a filled opening (2) through the semiconductor substrate (1) and the inner recess(es) form an electrically conductive connection as filled opening(s) (3).

14. A method in accordance with claim 13, characterized in that a contact element (4) is contacted in an electrically conductive manner to the exposed electrically conductive material in the inwardly arranged opening(s) (3) at the rear side of the semiconductor substrate (1).

15. A method in accordance with claim 13, characterized in that the reduction of the thickness of the semiconductor substrate (1) is carried out by grinding, chemo-mechanical polishing and/or an etching process.

16. A method in accordance with claim 13, characterized in that the outer recess is also filled with the electrically conductive material.

17. A method in accordance with claim 13, characterized in that the electrically insulating coating is formed by oxidation of silicon as the substrate material.

18. A method in accordance with claim 13, characterized in that the electrically conductive material is exposed at least regionally in the inner recess(es) at the front side before the reduction in thickness of the semiconductor substrate (1) and is connected to an electrically conductive layer or to a contact element.

19. A method in accordance with claim 13, characterized in that a CMOS circuit structure is formed on the front side after formation of the electrically conductive connection through the semiconductor substrate.

20. A method in accordance with claim 13, characterized in that a plurality of sensor elements are electrically conductively connected at the front side of the semiconductor substrate (1) and a sensor array element is established.

21. A method in accordance with claim 13, characterized in that a plurality of electrically controllable elements are electrically conductively connected on the front side of the semiconductor substrate (1) and an array equipped with electrically controllable elements is established.

\* \* \* \* \*